(12) United States Patent
Pinol Pedret et al.

(10) Patent No.: US 7,459,630 B2
(45) Date of Patent: Dec. 2, 2008

(54) JUNCTION BOX ASSEMBLY

(75) Inventors: Montse Pinol Pedret, Tarragona (ES); Ramon Aguila Caceres, Tarragona (ES)

(73) Assignee: Lear Corporation, Southfield, MI (US)

( * ) Notice: Subject to any disclaimer, the term of this patent is extended or adjusted under 35 U.S.C. 154(b) by 70 days.

(21) Appl. No.: 11/538,929

(22) Filed: Oct. 5, 2006

(65) Prior Publication Data
US 2008/0083547 A1    Apr. 10, 2008

(51) Int. Cl.
H02G 3/08    (2006.01)

(52) U.S. Cl. .............................. 174/50; 174/58; 174/60; 174/135; 248/56; 220/4.02

(58) Field of Classification Search .................... 174/50, 174/58, 59, 60, 50.52, 52.1, 135; 439/604, 439/76.1, 76.2, 949, 688, 621; 220/3.3, 3.8, 220/4.02, 3.2, 378; 248/56; 16/2.1, 2.2; 361/651, 736
See application file for complete search history.

(56) References Cited

U.S. PATENT DOCUMENTS

| | | | | |
|---|---|---|---|---|
| 4,890,318 A | * | 12/1989 | Crane et al. ............. | 379/413.02 |
| 5,078,266 A | * | 1/1992 | Rackley ....................... | 206/349 |
| 6,102,733 A | * | 8/2000 | Anderson et al. ........... | 439/535 |
| 6,514,091 B2 | | 2/2003 | Saito et al. | |
| 6,545,217 B2 | | 4/2003 | Sato | |
| 6,570,088 B1 | | 5/2003 | Depp et al. | |
| 6,743,981 B2 | | 6/2004 | Miyakoshi | |
| 6,833,503 B2 | | 12/2004 | Lopez et al. | |
| 6,870,096 B2 | * | 3/2005 | Suzuki et al. .................. | 174/50 |
| 6,870,097 B2 | | 3/2005 | Oda | |
| 6,929,489 B2 | | 8/2005 | Asao et al. | |
| 6,992,248 B1 | | 1/2006 | Dunbar et al. | |
| 7,017,764 B2 | | 3/2006 | Okada | |
| 7,053,298 B2 | * | 5/2006 | Ikeda et al. .................... | 174/50 |
| 7,075,006 B2 | | 7/2006 | Nojima et al. | |
| 7,253,356 B2 | * | 8/2007 | Kiyota et al. ............ | 174/17 VA |
| 7,321,096 B1 | * | 1/2008 | Huang .......................... | 174/58 |
| 2002/0084271 A1 | | 7/2002 | Sato et al. | |
| 2003/0000726 A1 | | 1/2003 | Miyakoshi | |
| 2003/0230574 A1 | | 12/2003 | Okada | |
| 2005/0194167 A1 | | 9/2005 | Kiyota et al. | |
| 2006/0021779 A1 | | 2/2006 | Kanazawa | |
| 2006/0128182 A1 | | 6/2006 | Rho | |
| 2006/0199404 A1 | | 9/2006 | Kubota | |

* cited by examiner

*Primary Examiner*—Dhiru R Patel
(74) *Attorney, Agent, or Firm*—Brooks Kushman P.C.

(57) ABSTRACT

The embodiments described herein include a junction box assembly configured to enclose an electrical assembly. The junction box assembly includes a junction box cover and a base member. The junction box cover and base member are configured to enable optimal sealing, securing, and positioning of the electrical assembly within the junction box assembly.

21 Claims, 4 Drawing Sheets

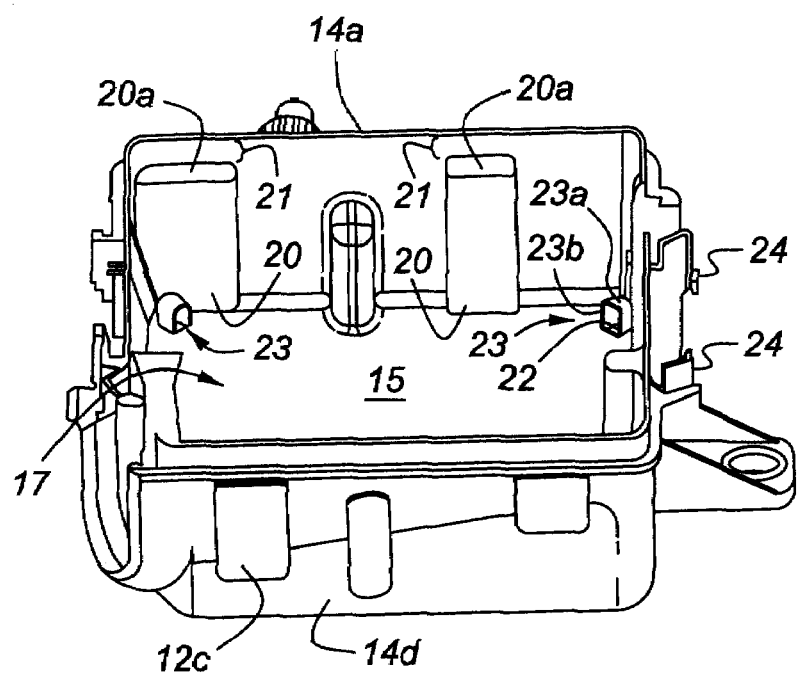
Figure 2
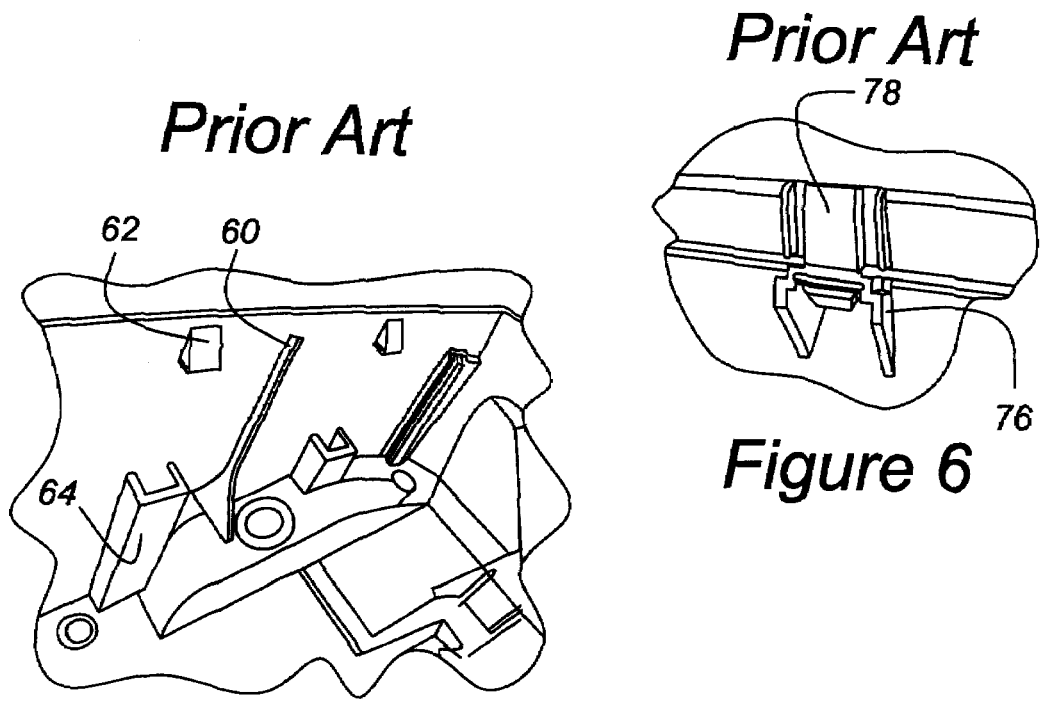
Figure 5
Figure 6

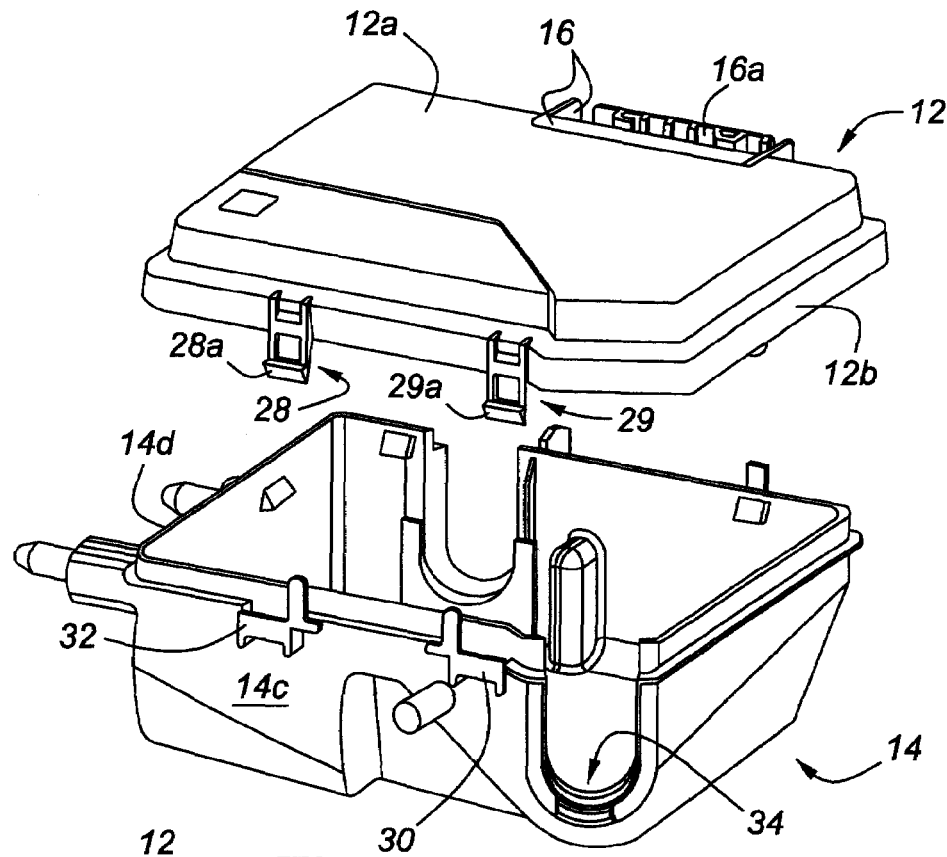
Figure 3A
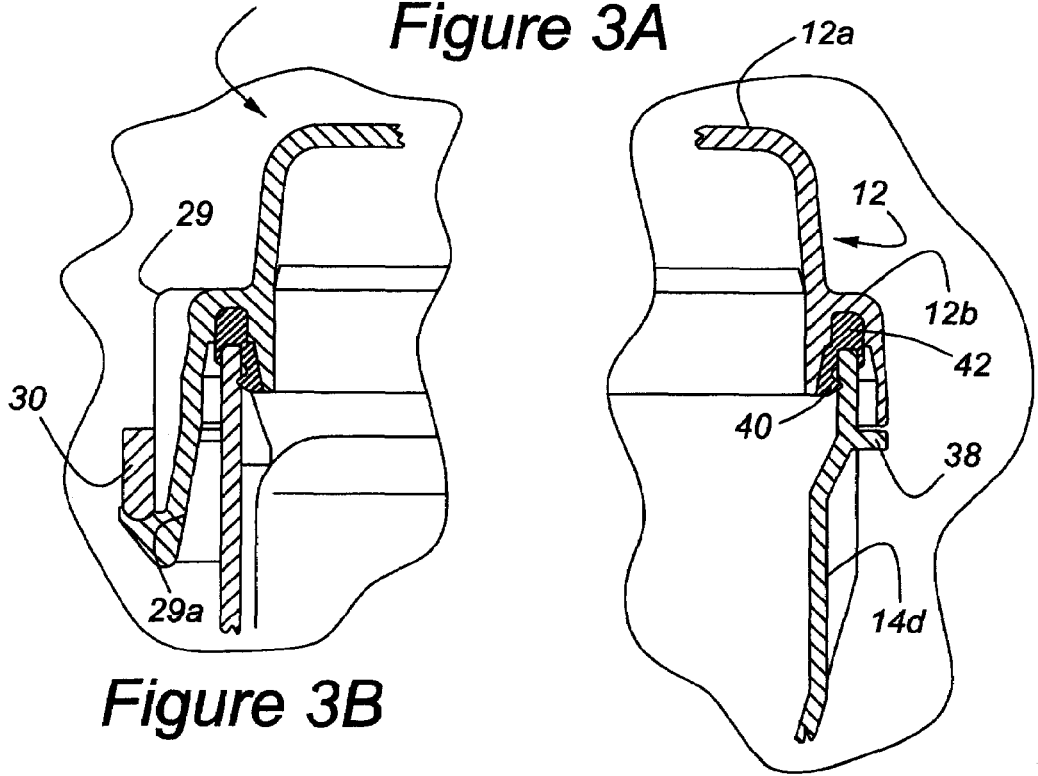
Figure 3B
Figure 3C

JUNCTION BOX ASSEMBLY

CROSS-REFERENCE TO RELATED APPLICATIONS

This application is related to U.S. patent application entitled "INSERT, PLASTIC PART ASSEMBLY UTILIZING SAME AND DIE-CASTING MOLD FOR MAKING THE INSERT" filed on the same day as this application and having U.S. Ser. No. 11/538,939.

TECHNICAL FIELD

The embodiments described herein relate to a junction box assembly.

BACKGROUND

Junction box assemblies are configured to contain a plurality of electrical devices such as fuses, connectors and the like. When installed in a vehicle, it is desirable that the electronics within the junction box assembly remain free of fluids and debris that could damage the electronics. Accordingly, designers have developed a number of sealing mechanisms in an effort to protect the electronics from undesirable elements. However, many of these sealing mechanisms fail over time due to excessive wear and/or movement/vibration of the junction box assembly walls.

Additionally, it is well known that conventional junction box assemblies require a minimal level of rigidity to prevent deforming of the junction box assembly walls. Furthermore, it is known that the junction box assembly typically requires a member(s) for positioning and stabilizing the electronics within the junction box. A conventional junction box assembly designed to address the above needs is shown in FIG. 5. FIG. 5 includes the interior portions of a conventional junction box. The junction box has side wall ribs 60, a positioning member 62, and a positioning member 64. Ribs 60, which are thinly molded members, provide structural support to the sidewalls of the junction box assembly. However, after manufacturing of ribs 60, it is known that imprints of ribs 60 may appear on the outer surface of are the junction box assembly. This is highly undesirable to customers.

Positioning members 62 and 64 provide a means for holding the electronics (not shown). The positioning members 62 and 64 are burdensome to manufacture. As such, with the conventional junction box assembly the ribs 60 and positioning members 62 and 64 are required for providing structural support and positioning of the electronics.

Furthermore, junction box assemblies are commonly located within an engine compartment of a vehicle. In such a case, access to the electronics within the junction box assembly is compromised by the construction of the junction box assembly. Specifically, the design of the hinges on conventional junction box assemblies prevents easy removal of a cover of the junction box assembly. It is known that conventional junction box assemblies require two hands for removal of the junction box assembly cover. An example of such a conventional junction is shown in FIG. 6. The prior art junction box hash a hinge bracket 76 and a hinge member 78. As stated above, conventional junction boxes, such as the junction box in FIG. 6, require two hands to remove the cover from the junction box assembly due to the hinge brackets 76 and 78.

The embodiments described herein were conceived in view of these and other disadvantages of conventional junction box assemblies.

SUMMARY

The embodiments described herein include a junction box assembly configured to enclose an electrical assembly. The junction box assembly includes a junction box cover having an upper portion and a lower portion, wherein the upper portion and the lower portion have a closure member integrated thereto. The closure member has an opening for receiving a locking member. The lower portion also has a first latch and a second latch extending therefrom, wherein the first latch terminates at a first engagement portion and the second latch terminates at a second engagement portion.

A base member is also included, which has a plurality of connecting sidewalls that extend from a bottom wall to form a cavity. In one embodiment, one wall includes a first hinging member and a second hinging member that are configured to receive the first engagement portion and the second engagement portion, respectively. A second sidewall has a blocking member that engages the closure member. The locking member is configured to force the closure member against the locking member when the locking member is received within the opening of the closure member, thereby securing the junction box cover to the base member.

BRIEF DESCRIPTION OF THE DRAWINGS

The features of the embodiments herein are set forth with particularity in the appended claims. The present invention, both as to its organization and manner of operation, together with further advantages thereof, may be best understood with reference to the following description, taken in connection with the accompanying drawings in which:

FIG. 2 provides a detailed illustration of a base member of FIG. 1A in accordance with an embodiment of the present invention;

FIG. 3A illustrates a junction box assembly having a junction box cover separated from a base member in accordance with an embodiment of the present invention;

FIG. 3B is an enlarged view of an hinging mechanism for a junction box assembly in accordance with an embodiment of the present invention;

FIG. 3C is an enlarged view of a seal for a junction box assembly in accordance with the present invention;

FIG. 5 is a prior art junction box assembly; and

FIG. 6 is a prior art junction box assembly illustrating a conventional hinging mechanism.

DETAILED DESCRIPTION OF THE PREFERRED EMBODIMENT(S)

As required, detailed embodiments are disclosed herein. However, it is to be understood that the disclosed embodiments are merely exemplary of the invention that may be embodied in various and alternative forms. The figures are not necessarily to scale, and some features may be exaggerated or minimized to show details of particular components. Therefore, specific functional details disclosed herein are not to be interpreted as limiting, but merely as a representative basis for the claims and/or as a representative basis for teaching one skilled in the art to variously employ in the present invention.

Figure 1A:
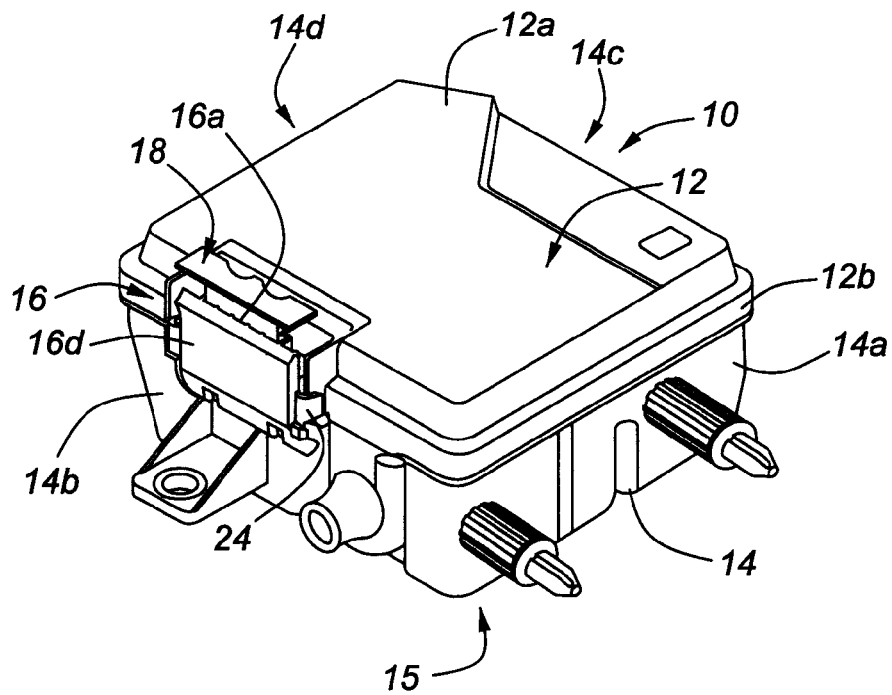
FIG. 1A illustrates a junction box assembly according to an embodiment of the present invention.

FIG. 1A illustrates a junction box assembly 10 in accordance with an embodiment of the present invention. The junction box assembly 10 may be formed through an injection molding process. Additionally, the junction box assembly 10 may be formed of a polypropylene, polyester, polyamide, and/or any other filled or unfilled plastic materials.

Junction box assembly 10 includes a junction box cover 12 and a base member 14. An upper portion 12a and a lower portion 12b form junction box cover 12. As will be describe below, the lower portion 12b includes a sealing member that enables the junction box cover to be sealed to the base member 14. The upper portion 12a and lower portion 12b have a closure member 16 integrated thereto. The closure member 16 enables the junction box cover 12 to be secured to the base member 14.

Figure 1B:
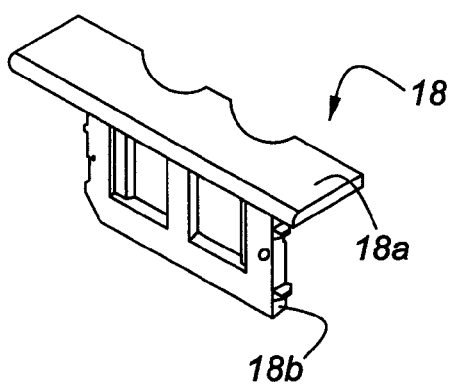
FIGS. 1B and 1C are enlarged illustrations of a locking member and a closure member shown in FIG. 1A in accordance with an embodiment of the present invention.

Closure member 16 includes an opening 16a for receiving a locking member 18. As shown in FIG. 1B, the locking member 18 includes a first end 18a and a second end 18b. The second end 18b has a shape that corresponds to the shape of opening 16a. The first end 18a is substantially flat to enable the locking member 18 to be pushed into the opening 16a or pulled from opening 16a. Inserting locking member 18 fully into the opening 16a secures junction box cover 12 to base member 14. Alternatively, pulling locking member 18 out of opening 16a allows movement of junction box cover 12.

Figure 1C:
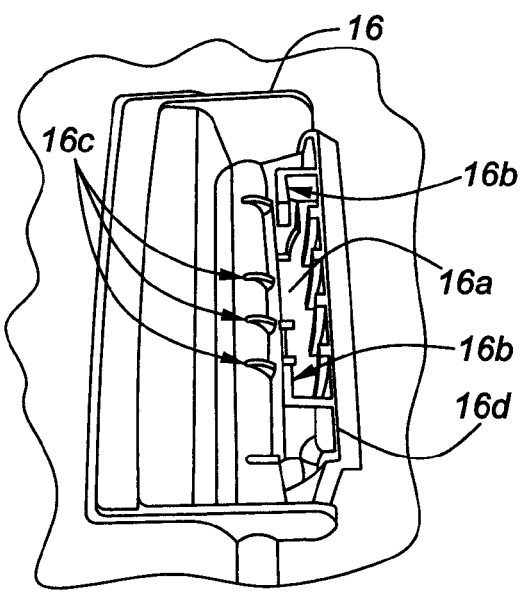

As shown, closure member 16 also includes a closure member panel 16d. In FIG. 1C, the opening 16a is defined by the closure member panel 16d and brackets 16b. Brackets 16b are L-shaped brackets that extend from the closure member panel to define the opening 16a. The closure member 16 also includes multiple biasing members 16c. Biasing members 16c help bias the locking member 18 away from the junction box assembly 10 in the direction of closure member panel 16d when the locking member is received within opening 16a.

Referring specifically to FIG. 1A, the base member 14 includes a plurality of connected sidewalls 14a, 14b, 14c, and 14d. Sidewalls 14a, 14b, 14c, and 14d extend from a bottom wall 15 to form a cavity within the base member 14. As recognized by one of ordinary skill in the art, the cavity is an area within the base member for enclosing an electrical assembly (not shown) such as a fuse and or electrical distribution box.

As shown, sidewall 14b includes a blocking member 24. The blocking member 24 is rigidly formed to project outward away from base member 14 to inhibit movement of closure panel 16d when the locking member 18 is received within opening 16a. When locking member 18 is received within opening 16a, the closure member panel 16d is forced outward until it contacts blocking member 24. As locking member 18 is fully inserted in opening 16a, the closure member panel 16d is forced against blocking member 24 thereby establishing a secure fitting between junction box cover 12 and base member 14.

Referring to FIG. 2, a detailed illustration of base member 14 is provided. As described in the foregoing, base member 14 includes a plurality of connected sidewalls 14a-14d and a bottom wall 15 that define a cavity 17. The sidewalls 14a-14d include an upper area 21 that is located at the top of sidewalls 14a-14d. Multiple positioners 20 are integrated with at least one sidewall and enable positioning and securing of the electrical assembly (not shown) within the base member. Positioners 20 have a substantially rectangular shape and a top side 20a that is in close proximity to upper area 21. In one embodiment, the top side 20a is less than 1 inch (2.54 centimeters) from the top of the sidewalls 14a-14d. Accordingly, the embodiments described herein do not require structural ribs in addition to positioning members for positioning an electrical assembly and providing structural support to the junction box sidewalls. The positioners 20 are configured to provide robustness to the sidewalls and optimally position the electrical assembly within the junction box assembly.

Integrated with bottom wall 15 are drainage members 23. The drainage members cover a drain holes 22 that allow fluids within base member 14 to exit. Drainage members 23 extend from the bottom wall 15 and have a top 23a and sides 23b. The top 23a and sides 23b enable fluids that enter the junction box assembly to be channeled in a substantially horizontal direction so as to minimize the chance of fluids reaching the electrical assembly enclosed therein.

Now, referring to FIG. 3A, an alternative view of a junction box is shown. In this view, junction box cover 12 is shown having latches 28 and 29. Lower portion 12b has latches 28 and 29 extending therefrom. Latch 28 terminates at an engagement portion 28a, while latch 29 terminates at an engagement portion 29a. Additionally, base member 14 includes hinging members 32 and 30. The hinging member 32 and 30 are configured to receive the engagement portion 28a and 29a respectively. The configuration of the engagement portion 29a and 28a coupled with the configuration of hinging members 30 and 32 enable the junction box cover 12 to be lifted slightly and rotated 10 degrees or less in reference to the base member to remove the junction box cover 12. As such, removal of junction box cover 12 does not require two hands as with prior art junction box assemblies. FIG. 3B illustrates a cross-sectional view of latch 29 having engagement portion 29a received by hinging member 30.

FIG. 3A also illustrates a grommet positioner 34 that defines a grommet opening for receiving a grommet. As recognized by one of ordinary skill in the art, the grommet is a sealing device through which wires enter the junction box assembly for connection to the internal electrical assembly. The grommet positioner 34 as shown is U-shaped and defines a grommet opening.

Referring to FIG. 3C, an enlarged cross-sectional view of junction box cover 12 and sidewall 14d is shown. Sidewall 14d includes a ledge 38 that projects laterally outward from sidewall 14d. As illustrated, the lower portions 12b of junction box cover 12 include a sealing member which may be formed of an elastic material. The sealing member may be a single or multiple sealing members. Accordingly, the sealing member includes an internal sidewall sealing portion 40 and a top edge sealing portion 42. As the junction box cover 12 is installed on the base member 14, the junction between the junction box cover and the base member is sealed to minimize fluid ingress.

Figure 4A:
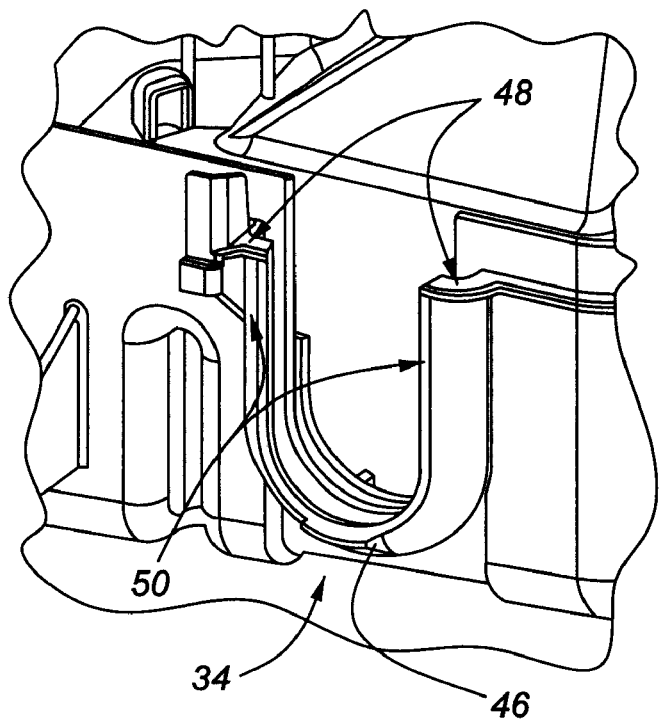
FIGS. 4A and 4B are enlarged illustrations of a grommet positioner in accordance with an embodiment of the present invention.
Figure 4B:
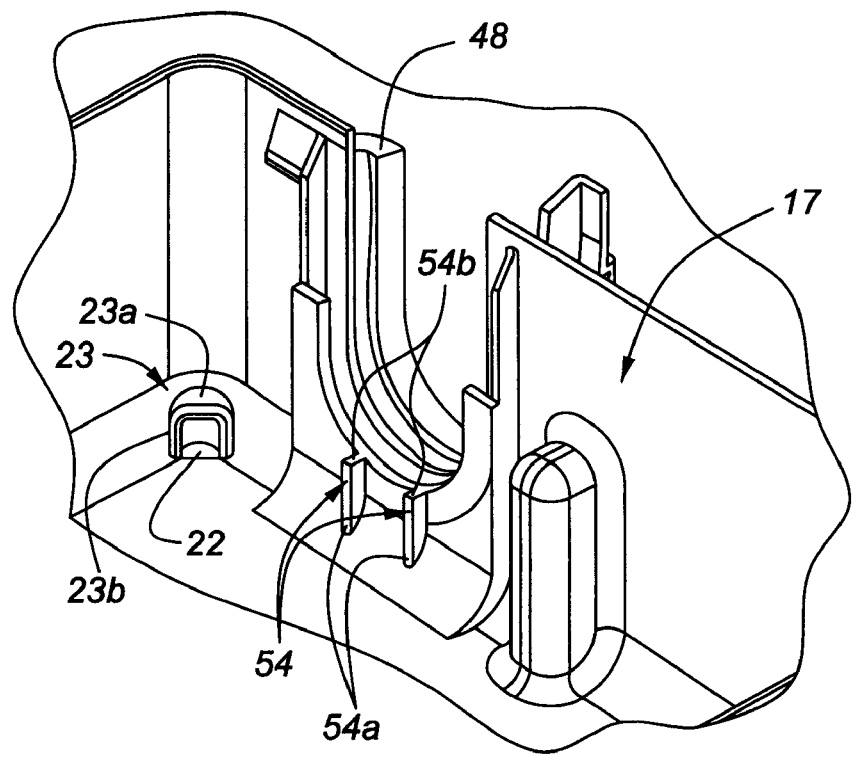

Now, referring to FIGS. 4A and 4B, enlarged views of grommet positioner 34 are provided. The grommet positioner 34 helps ensure optimal placement of a grommet into the base member 14. Accordingly, the grommet positioner includes a rim 48 that extends substantially normal from sidewalls of the base member 14. A flange also extends downward from rim 48 to be substantially parallel with the sidewalls. Accordingly, the rim 48 and flange 50 define the opening for the grommet.

A grommet positioner lip 46 is integrally molded with flange 50. Grommet positioner lip 46 is located at the bottom of the U-shaped grommet positioner 34. Grommet positioner lip 46 extends from flange 50 in a direction away from the cavity within the base member. In FIG. 4B, a view looking outward from cavity 17 of grommet positioner 34 is provided.

Within the cavity 17, are multiple projections 54. Projections 54 are located within the cavity 17 and have a first side 54a and a second side 54b. First side 54a extends upward in a direction away from bottom wall in a manner that is substantially parallel with a sidewall. Additionally, the first side 54a terminates at the second side 54b. The second side which is located at the bottom of the grommet positioner has a position that is normal to the sidewall. The projections 54 form a guide for the positioning of a grommet within the opening defined by grommet positioner 34.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A junction box assembly configured to enclose an electrical assembly, the assembly comprising:
    a junction box cover having an upper portion and a lower portion, the upper portion and the lower portion having a closure member integrated thereto, wherein the closure member has an opening for receiving a locking member, the lower portion having a first latch and a second latch extending therefrom, the first latch terminating at a first engagement portion and the second latch terminating at a second engagement portion;
    a base member having a plurality of sidewalls connected to each other that extend from a bottom wall to form a cavity, wherein a first sidewall of the plurality of sidewalls includes a first hinging member and a second hinging member that are configured to receive the first engagement portion and the second engagement portion, respectively; and
    wherein a second sidewall of the plurality of sidewalls includes a blocking member that engages the closure member and the locking member forcing the closure member against the blocking member when the locking member is received within the opening of the closure member, thereby securing the junction box cover to the base member.

2. The assembly of claim 1, further comprising a drainage member that is integrated with the bottom wall for channeling fluids out of the base member, the drainage member covering a drain hole and extending from the bottom wall.

3. The assembly of claim 2, further comprising a plurality of positioners being integrated with at least one sidewall of the plurality of sidewalls for positioning the electrical assembly within the base member and providing structural support for the at least one sidewall, the positioners, having a substantially rectangular shape and a top side that is in close proximity to an upper area of the at least one sidewall.

4. The assembly of claim 1, wherein the first latch and the second latch allow the junction box cover to be removed from the base member by rotating the junction box cover 10 degrees or less in reference to the base member.

5. The assembly of claim 1, wherein the closure member includes multiple brackets that extend from a closure member panel, the brackets and the closure member panel defining the opening for receiving the locking member.

6. The assembly of claim 5, wherein the closure member includes multiple biasing members for biasing the locking member away from the junction box assembly in the direction of the closure member panel when the locking member is received within the brackets that define the opening.

7. The assembly of claim 6, wherein the blocking member is rigidly formed to project outward away from the base member to inhibit movement of the closure member panel when the locking member is received.

8. The assembly of claim 1, further comprising:
    at least one grommet positioner located on at least one sidewall of the plurality of sidewalls of the base member, the grommet positioner being U-shaped and defining a grommet opening, the grommet positioner having a rim that extends substantially normal from the at least one sidewall; and
    a flange that extends downward from the rim substantially parallel with the at least one sidewall, wherein the rim and the at least one sidewall define an opening.

9. The assembly of claim 8, further comprising a grommet positioner lip integrally molded with the flange at a bottom of the U-shaped grommet positioner, wherein the grommet positioner lip extends from the flange in a direction away from the cavity.

10. The assembly of claim 9, further comprising multiple projections being located within the cavity and having a first side and a second side, the first side extending upward in a direction away from the bottom wall to be substantially parallel with the at least one sidewall, the first side terminating at the second side at the bottom of the grommet positioner, the second side extending from the bottom of the grommet positioner in a position that is normal to the at least one sidewall, wherein the projections form a guide for the positioning of a grommet.

11. The assembly of claim 1, further comprising a top edge sealer and an internal sidewall sealer within the lower portion of the junction box cover, the top edge sealer and the internal sidewall sealer providing a seal between the junction box cover and the base member.

12. A junction box assembly configured to enclose an electrical assembly, the assembly comprising:
    a junction box cover having an upper portion and a lower portion, the upper portion and the lower portion having a closure member integrated thereto, wherein the closure member has an opening for receiving a locking member, the lower portion having a first latch and a second latch extending therefrom, the first latch terminating at a first engagement portion and the second latch terminating at a second engagement portion; the lower portion further including a sealing member located therein;
    a base member having a plurality of sidewalls connected to each other that extend from a bottom wall to form a cavity, the bottom wall having multiple drainage members for channeling fluids that enter the junction box assembly in a substantially horizontal direction, the sidewalls having a lateral ledge that projects from the sidewalls away from the cavity, the lateral ledge enabling a seal between the junction box cover and the base member through the use of the sealing member; and
    wherein a first sidewall of the sidewalls includes a first hinging member and a second hinging member, the first hinging member being configured to receive the first engagement portion and the second hinging member being configured to receive the second engagement portion, wherein a second sidewall of the plurality of sidewalls includes a blocking member that engages the closure member, the locking member forcing the closure member against the blocking member when the locking member is received within the opening of the closure member, thereby securing the junction box cover to the base member.

13. The assembly of claim 12, further comprising a plurality of positioners being integrated with at least one sidewall of the plurality of sidewalls for positioning the electrical assembly within the base member and providing structural support for the at least one sidewall, the positioners, having a substantially rectangular shape and a top side that is in close proximity to an upper area of the at least one sidewall.

14. The assembly of claim 12, wherein the first latch and the second latch allow the junction box cover to be removed from the base member by rotating the junction box cover 10 degrees or less in reference to the base member.

15. The assembly of claim 12, wherein the closure member includes multiple brackets that extend from a closure member panel, the brackets and the closure member panel defining the opening for receiving the locking member.

16. The assembly of claim 15, wherein the closure member includes multiple biasing members for biasing the locking member away from the junction box assembly in the direction of the closure member panel when the locking member is received within the brackets that define the opening.

17. A junction box assembly configured to enclose an electrical assembly, the assembly comprising:
- a junction box cover having an upper portion and a lower portion, the upper portion and the lower portion having a closure member integrated thereto, wherein the closure member includes a closure member panel and an opening for receiving a locking member, the closure member including two L-shaped brackets that extend from the closure member panel, the brackets and the closure member panel defining the opening for receiving the locking member;
- wherein the lower portion has a first latch and a second latch extending therefrom, the first latch terminating at a first engagement portion and the second latch terminating at a second engagement portion; and
- a base member having a plurality of sidewalls connected to each other that extend from a bottom wall to form a cavity, wherein a first sidewall of the plurality of sidewalls includes a first hinging member and a second hinging member that is configured to receive the first engagement portion and the second engagement portion, respectively and wherein a second sidewall of the plurality of sidewalls includes a blocking member that engages the closure member, the locking member forcing the closure member against the blocking member when the locking member is received within the opening of the closure member, thereby securing the junction box cover to the base member.

18. The assembly of claim 17, further comprising a plurality of positioners being integrated with at least one sidewall of the plurality of sidewalls for positioning the electrical assembly within the base member and providing structural support for the at least one sidewall of the plurality of sidewalls, the positioners having a substantially rectangular shape and a top side that is in close proximity to an upper area of the at least one sidewall.

19. The assembly of claim 17, further comprising:
- at least one grommet positioner located on at least one sidewall of the plurality of sidewalls of the base member, the grommet positioner being U-shaped and defining a grommet opening, the grommet positioner having a rim that extends substantially normal from the at least one sidewall; and
- a flange that extends downward from the rim substantially parallel with the at least one sidewall, wherein the rim and the at least one sidewall define an opening.

20. The assembly of claim 19, further comprising a grommet positioner lip integrally molded with the flange at a bottom of the U-shaped grommet positioner, wherein the grommet positioner lip extends from the flange in a direction away from the cavity.

21. A junction box assembly configured to enclose an electrical assembly, the assembly comprising: a junction box cover having an upper portion and a lower portion, wherein at least one of the upper portion and the lower portion includes a closure member, wherein the closure member includes a closure member panel and wherein the closure member and the closure member panel define an opening for receiving a locking member; a base member having a plurality of sidewalls that extend from a bottom wall to define a cavity for positioning the electrical assembly therein; and a first sidewall of the plurality of sidewalls including a blocking member that engages the closure member, wherein the locking member forces the closure member against the blocking member when the locking member is received within the opening of the closure member to secure the junction box cover to the base member.

* * * * *

UNITED STATES PATENT AND TRADEMARK OFFICE
CERTIFICATE OF CORRECTION

PATENT NO. : 7,459,630 B2  
APPLICATION NO. : 11/538929  
DATED : December 2, 2008  
INVENTOR(S) : Pinol Pedret et al.

Page 1 of 1

It is certified that error appears in the above-identified patent and that said Letters Patent is hereby corrected as shown below:

Column 7, Line 18, Claim 17:  
Delete "Ajunction" and insert -- A junction --.

Column 8, Line 4, Claim 18:  
Delete "ofpositioners" and insert -- of positioners --.

Signed and Sealed this

Twenty-sixth Day of May, 2009

JOHN DOLL  
*Acting Director of the United States Patent and Trademark Office*